(12) United States Patent
Moon

(10) Patent No.: US 7,229,918 B2
(45) Date of Patent: Jun. 12, 2007

(54) NITROGEN RICH BARRIER LAYERS AND METHODS OF FABRICATION THEREOF

(75) Inventor: Bum Ki Moon, LaGrangeville, NY (US)

(73) Assignee: Infineon Technologies AG, Munich (DE)

( * ) Notice: Subject to any disclaimer, the term of this patent is extended or adjusted under 35 U.S.C. 154(b) by 171 days.

(21) Appl. No.: 11/057,631

(22) Filed: Feb. 14, 2005

(65) Prior Publication Data

US 2006/0183327 A1    Aug. 17, 2006

(51) Int. Cl.
  *H01L 21/44*    (2006.01)
(52) U.S. Cl. .................. 438/658; 438/685; 257/E21.07
(58) Field of Classification Search ................ 438/652, 438/627, 687, 656, 658, 605
See application file for complete search history.

(56) References Cited

U.S. PATENT DOCUMENTS

| 6,069,073 | A | 5/2000 | Kim et al. |
| 6,260,266 | B1 | 7/2001 | Tamaki |
| 6,284,649 | B1 | 9/2001 | Miyamoto |
| 6,500,761 | B1 | 12/2002 | Wajda et al. |
| 6,537,621 | B1 * | 3/2003 | Kobayashi et al. .......... 427/535 |
| 2003/0194859 | A1 * | 10/2003 | Huang ........................ 438/652 |

* cited by examiner

*Primary Examiner*—Scott B. Geyer
*Assistant Examiner*—Elias Ullah
(74) *Attorney, Agent, or Firm*—Slater & Matsil, L.L.P.

(57) ABSTRACT

Methods of forming barrier layers and structures thereof are disclosed. A nitrogen rich region is formed at a top surface of a barrier layer by exposing the barrier layer to a nitridation treatment. The nitrogen rich region increases the oxidation resistance of the barrier layer. The barrier layers have improved diffusion barrier properties. A stack of barrier layers may be formed, with one or more of the barrier layers in the stack being exposed to a nitridation treatment.

12 Claims, 3 Drawing Sheets

NITROGEN RICH BARRIER LAYERS AND METHODS OF FABRICATION THEREOF

TECHNICAL FIELD

The present invention relates generally to the fabrication of semiconductors, and more particularly to methods of forming barrier layers of semiconductor devices.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

In the past, aluminum was typically used as a conductive line material in integrated circuits. Silicon dioxide was typically used as the insulating material between aluminum conductive lines. However, as semiconductor devices are scaled down in size, there is a trend towards the use of copper for interconnect material, in conjunction with the use of low dielectric constant (k) materials. Advantages of using copper for interconnects in integrated circuits include decreased resistivity, resulting in increased speed, decreased RC time delay, and the ability to form thinner conductive lines. Copper has increased electromigration resistance, so that higher current densities may be used.

However, there are some challenges in working with copper in a manufacturing process. While aluminum may be subtractively etched, copper is difficult to subtractively etch, and thus, damascene processes are typically used to form copper conductive features. In a damascene process, a dielectric material is deposited over a wafer, and then the dielectric material is patterned with a conductive feature pattern. The conductive feature pattern typically comprises a plurality of trenches, for example. The trenches are then filled in with conductive material, and a chemical-mechanical polish (CMP) process is used to remove the excess conductive material from the top surface of the dielectric material. The conductive material remaining within the dielectric material comprises conductive features such as conductive lines or vias, as example.

Copper has a tendency to diffuse into adjacent material layers, such as the insulating layers the copper interconnects are formed in. Thus, diffusion barriers are used to prevent the diffusion of copper. Typical diffusion barrier materials are Ta and TaN, as examples. Because these materials have a higher resistance than copper, the diffusion barriers are typically made very thin to avoid excessively increasing the resistance of conductive features. These thin prior art diffusion barriers have a tendency towards the formation of weak spots and holes, which can permit copper to diffuse into adjacent material layers.

Thus, what are needed in the art are improved diffusion barrier layers and methods of formation thereof.

SUMMARY OF THE INVENTION

These and other problems are generally solved or circumvented, and technical advantages are generally achieved, by preferred embodiments of the present invention, which provide methods of forming improved barrier layers and structures thereof.

In accordance with a preferred embodiment of the present invention, a method of forming a barrier layer on a material layer of a semiconductor device includes forming a first barrier layer over the material layer, the first barrier layer having a top surface, and exposing the first barrier layer to a nitridation treatment, forming a nitrogen rich region at the top surface of the first barrier layer.

In accordance with another preferred embodiment of the present invention, a semiconductor device includes a material layer disposed over a workpiece, and a first barrier layer disposed over the material layer, the first barrier layer including a nitrogen rich region formed at a top surface thereof.

Advantages of preferred embodiments of the present invention include providing improved barrier layers having a nitrogen rich region at the top surface thereof. The novel barrier layers described herein have improved copper diffusion barrier properties and increased oxidation resistance. In some embodiments, only the surface of the barrier layers are nitrided, resulting in a barrier layer with reduced electrical resistance.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless other-

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the formation of barrier layers on insulating material layers. The invention may also be applied, however, to the formation of barrier layers on other material layers, such as semiconductive materials or conductive materials, as examples.

Embodiments of the present invention achieve technical advantages by providing novel methods of forming barrier layers having improved properties, such as improved diffusion prevention and increased oxidation resistance.

Figure 1:
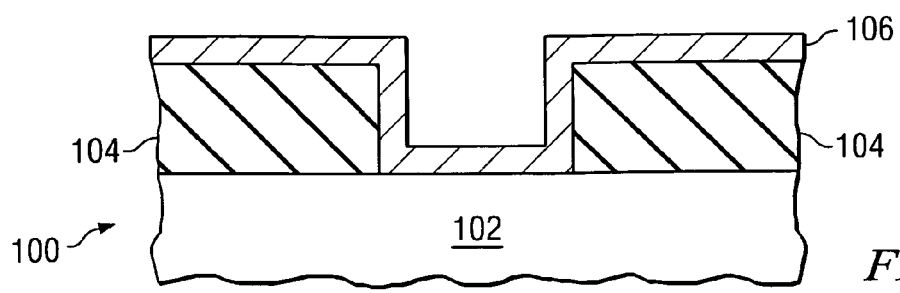
FIGS. 1 through 3 show cross-sectional views of a semiconductor device at various stages of manufacturing in accordance with an embodiment of the invention.
Figure 2:
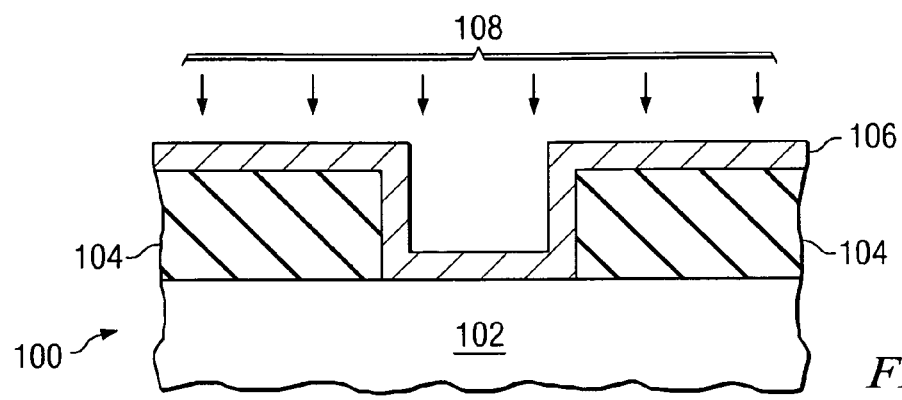
Figure 3:
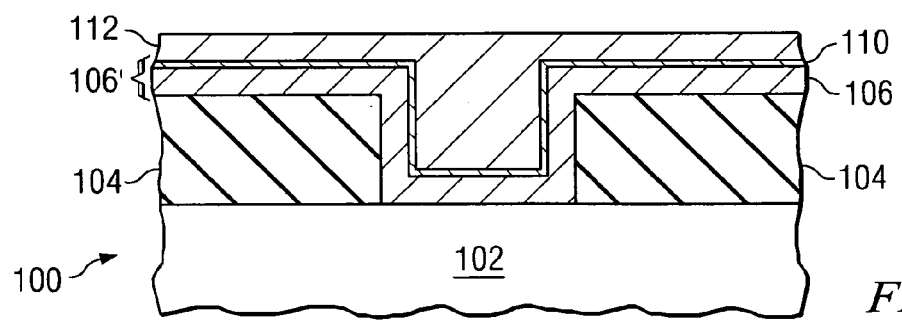

FIGS. 1 through 3 show cross-sectional views of a semiconductor device at various stages of manufacturing in accordance with a preferred embodiment of the invention. Referring first to FIG. 1, a cross-sectional view of a semiconductor device 100 is shown. The semiconductor device 100 includes a workpiece 102. The workpiece 102 may include a semiconductor substrate comprising silicon or other semiconductor materials covered by an insulating layer, for example. The workpiece 102 may also include other active components or circuits formed in a front end of line (FEOL) and/or or back end of line (BEOL), not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. For example, the workpiece 102 may include component regions or various circuit elements formed therein. The workpiece 102 may include a variety of material layers formed thereon, for example, metal layers, semiconductive layers, dielectric layers, conductive layers, etc., not shown.

A material layer 104 is formed over the workpiece 102. The material layer 104 may comprise conductive, insulative, or semiconductive materials, for example. In one embodiment of the invention, the material layer 104 preferably comprises an insulating material, for example. The material layer 104 preferably comprises insulating materials typically used in semiconductor manufacturing as inter-level dielectric (ILD) layers, such as $SiO_2$, SiN, SiON, or low k insulating materials, e.g., having a dielectric constant of about 3.5 or less, or combinations or multiple layers thereof, as examples, although alternatively, the material layer 104 may comprise other materials. The material layer 104 may comprise dense SiCOH or a porous dielectric having a k value of about 2.7 or higher, as examples. The material layer 104 may comprise an ultra-low k material having a k value of about 2.3, for example.

The material layer 104 may comprise a thickness of about 500 nm or less, for example, although alternatively, the material layer 104 may comprise other dimensions. The material layer 104 may have been previously patterned using lithography, as shown, e.g., in a damascene process, although alternatively, the material layer 104 may be planar and unpatterned (not shown in FIGS. 1 through 3; see FIGS. 6 through 8). The material layer 104 may be patterned using a reactive ion etch (RIE) and ash process, for example, followed by a damage recovery process, such as a wet etch and/or silylation, as examples.

A barrier layer 106 is formed over the material layer 104, and over exposed portions of the workpiece 102, if the material layer 104 has been patterned, as shown. The barrier layer 106 is also referred to herein as a first barrier layer. The barrier layer 106 preferably comprises Ta, TaN, Ti, TiN, W, WN, TaSi, TaSiN, TiSi, TiSiN, or multiple layers or combinations thereof, as examples, although alternatively, the barrier layer 106 may comprise other materials. The barrier layer 106 preferably comprises a thickness of about 5 to 100 Angstroms, and more preferably comprises a thickness of about 150 Angstroms or less, for example. The barrier layer 106 may be deposited by physical vapor deposition (PVD), chemical vapor deposition (CVD), or atomic layer deposition (ALD), as examples, although alternatively, the barrier layer 106 may be formed using other methods. The barrier layer 106 is preferably substantially conformal, e.g., conforms to the underlying topography of the material layer 104, lining the top surface and sidewalls, and the exposed top surface of the workpiece 102.

In one embodiment, the barrier layer 106 preferably comprises a first layer comprising about 150 Angstroms or less of TaN and a second layer comprising about 150 Angstroms or less of Ta formed over the TaN first layer, for example, to be described further herein. In another embodiment, the barrier layer preferably comprises a first layer comprising about 150 Angstroms or less of TaN and a plurality of second layers comprising about 150 Angstroms or less of Ta and/or TaN formed over the TaN first layer, for example, also to be described further herein. If the barrier layer 106 comprises two or more layers, preferably the barrier layer 106 comprises a thickness of about 150 Angstroms or less, or about ½ the width of the patterns in the material layer 104 or less, so that the barrier layer 106 preferably does not completely fill the patterns in the material layer 104, for example.

Next, the top surface of the barrier layer 106 is exposed to a nitridation treatment 108, as shown in FIG. 2 in a cross-sectional view, to form a barrier layer 106' having a nitrogen rich region 110 disposed at a top surface thereof, as shown in FIG. 3. The nitridation treatment 108 preferably comprises a gas or chemical treatment that is adapted to cause nitrogen atoms N to bond with the top surface of the barrier layer 106 and form a nitrogen rich region 110 at the top surface of the barrier layer 106', as shown in FIG. 3. The nitrogen rich region 110 comprises TaN, TiN, WN, TaSiN, or TiSiN, as examples, although the nitrogen rich region 110 may alternatively comprise other nitride materials. The nitrogen rich region 110 is preferably relatively thin and may comprise a thickness of about 5 to 10 Angstroms, and more preferably comprises a thickness of about 15 Angstroms or less, although the nitrogen rich region 110 may alternatively comprise other dimensions, for example. If the barrier layer 106 comprises Ta or TaN, the nitrogen rich region 110 preferably comprises TaN with an increased number of nitrogen atoms, and if the barrier layer 106 comprises Ti or TiN, the nitrogen rich region 110 preferably comprises TiN, as examples.

The nitridation treatment 108 may comprise exposing the barrier layer 106 to $N_2$ plasma, $N_2/H_2$ plasma, $NH_3$ plasma, or a rapid thermal process (RTP) in a nitrogen gas ambient, as examples, although alternatively, the nitridation treatment 108 may comprise other nitrogen-containing treatments. The nitridation treatment 108 preferably is performed at a temperature of about 300 to 750 degrees C., and more preferably comprises a temperature of about 750 degrees C. or less in one embodiment. If a RTP process is used, preferably a rapid thermal nitridation process is used in an $N_2$ gas ambient comprising about 99.999% nitrogen, for example, although other gas ambients may also be used. The temperature and time of the nitridation treatment 108 may be adjusted and controlled to adjust the thickness of the nitrogen rich region 110, for example. Preferably, in one embodiment, the nitridation treatment 108 is controlled so that nitrogen is not introduced into the material layer 104, for example.

The nitridation treatment 108 may be performed in situ or ex situ, for example. In particular, the barrier layer 106 may be formed in a first chamber and the nitridation treatment 108 may be performed in the same first chamber (e.g., in situ). Alternatively, the barrier layer 106 may be formed in a first chamber, and the nitridation treatment 108 may be formed in a second chamber (e.g., ex situ).

A conductive material 112 is then deposited over the barrier layer 106', as shown in FIG. 3. The conductive material 112 may comprise copper, aluminum, tungsten, or combinations or alloys thereof, as examples, although alternatively, the conductive material 112 may comprise other materials. The conductive material 112 may include a seed layer (not shown) that is deposited or formed over the barrier layer 106' before depositing the conductive fill material. For example, if the conductive material comprises copper, a copper seed layer comprising about 500 Angstroms of less of pure copper may be formed over the barrier layer 106', and the copper conductive material 112 may then be electroplated. Alternatively, other materials may be deposited to facilitate the deposition of the conductive material 112, such as a HfN/Hf or AlN/Hf material stack, for direct plating of the conductive material 112, for example.

Excess conductive material 112 and the barrier layer 106' may then be removed from over the top surface of the material layer 104 (not shown) using a CMP process and leaving conductive features comprised of the conductive material 112 and the barrier layer 106' formed in the patterns in the material layer 104.

FIGS. 4 and 5, 6 through 8, 9 and 10 show additional preferred embodiments of the present invention. Like numerals are used for the various elements that were described in FIGS. 1 through 3. To avoid repetition, each reference number shown in FIGS. 4 and 5, 6 through 8, 9 and 10 is not described again in detail herein. Rather, similar materials x02, x04, x06, x08, etc. are preferably used for the various material layers shown as were described for FIGS. 1 through 3, where x=1 in FIGS. 1 through 3, x=2 in FIGS. 4 and 5, x=3 in FIGS. 6 through 8, x=4 in FIG. 9, and x=5 in FIG. 10. As an example, the preferred and alternative materials and dimensions described for the barrier layer 106 in the description for FIGS. 1 through 3 are preferably also used for the barrier layer 206 of FIGS. 4 and 5.

Figure 4:
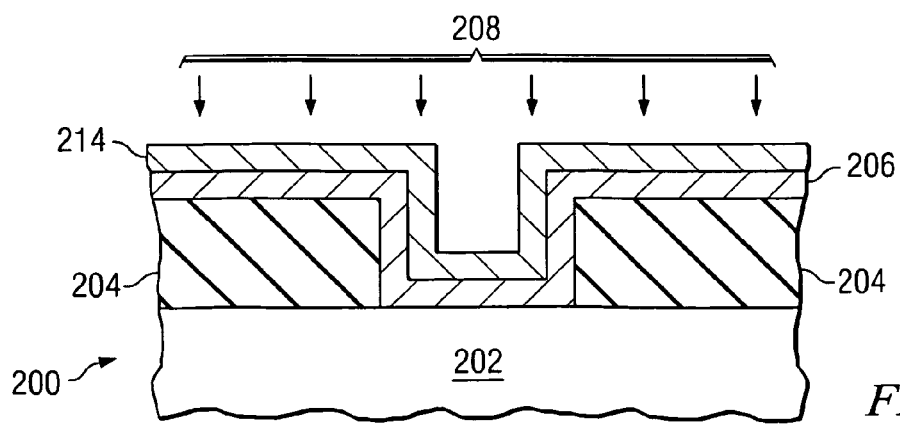
FIGS. 4 and 5 show cross-sectional views of a semiconductor device at various stages of manufacturing in accordance with another embodiment of the invention.
Figure 5:
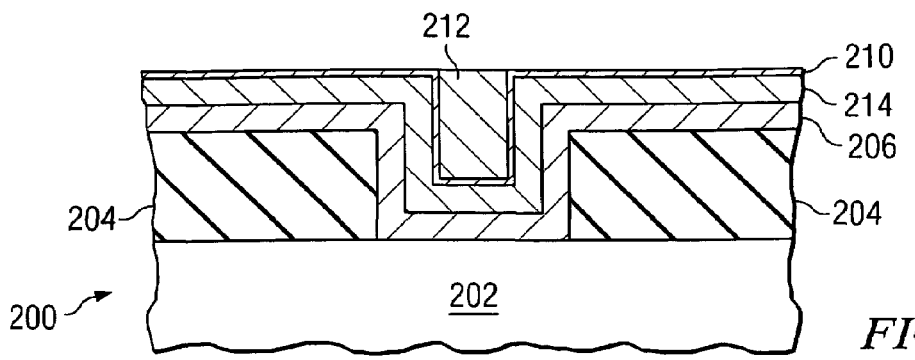

FIGS. 4 and 5 show cross-sectional views of a semiconductor device 200 at various stages of manufacturing in accordance with another embodiment of the invention. In this embodiment, the barrier layer 206/214 includes a first layer of material 206 and a second layer of material 214. The second layer of material 214 preferably comprises a different material than the first layer of material 206 in this embodiment. For example, the first layer of material 206 may comprise about 5 to 100 Angstroms of TaN or Ta, and the second layer of material 214 may comprise about 5 to 100 Angstroms of Ta or TaN, respectively. Alternatively, the first layer of material 206 may comprise about 5 to 100 Angstroms of TiN or Ti, and the second layer of material 214 may comprise about 5 to 100 Angstroms of Ti or TiN, respectively, for example. The second layer of material 214 may comprise Ta, TaN, Ti, TiN, W, WN, TaSi, TaSiN, TiSi, TiSiN, or multiple layers or combinations thereof, as examples, although alternatively, the second layer of material 214 may comprise other materials.

The barrier layer 206/214 is exposed to a nitridation treatment 208, as shown in FIG. 4. A nitrogen rich region 210 is formed at the top surface of the barrier layer 206/214, e.g., within the top surface of the second layer of material 214, as shown in FIG. 5. If the second layer of material 214 comprises Ta, and the first layer of material 206 comprises TaN, for example, the nitrogen rich region 210 comprises a layer of TaN formed within the top surface of the Ta second layer of material 214, for example.

Again, a conductive material 212 may be formed over the nitrogen rich region 210, as shown in FIG. 5. The conductive material 212 may be removed from over the material layer 204, as shown. The barrier layer 206/214/210 may also be removed from over unpatterned regions of the material layer 204 (not shown), e.g., using a CMP process.

Figure 6:
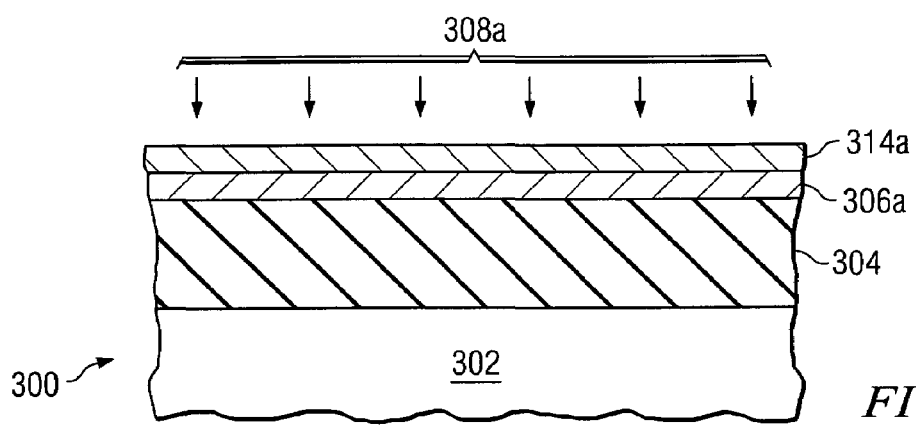
FIGS. 6 through 8 shows cross-sectional views of a semiconductor device at various stages of manufacturing in accordance with another embodiment of the invention.
Figure 7:
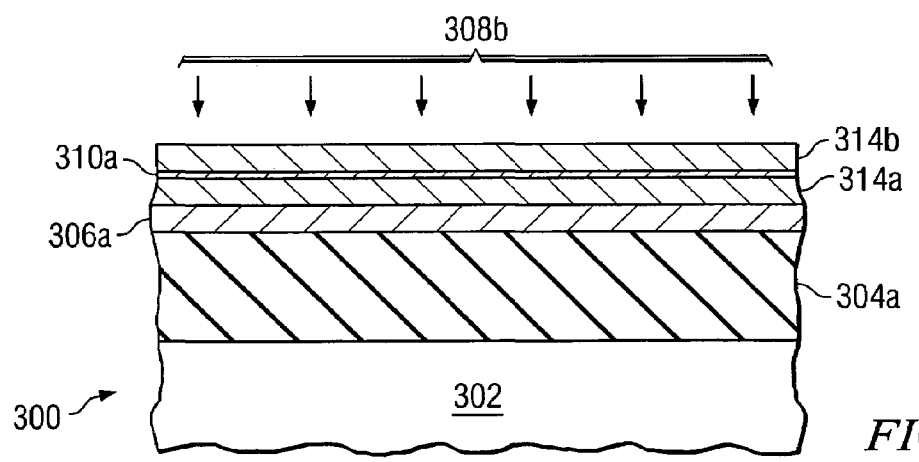
Figure 8:
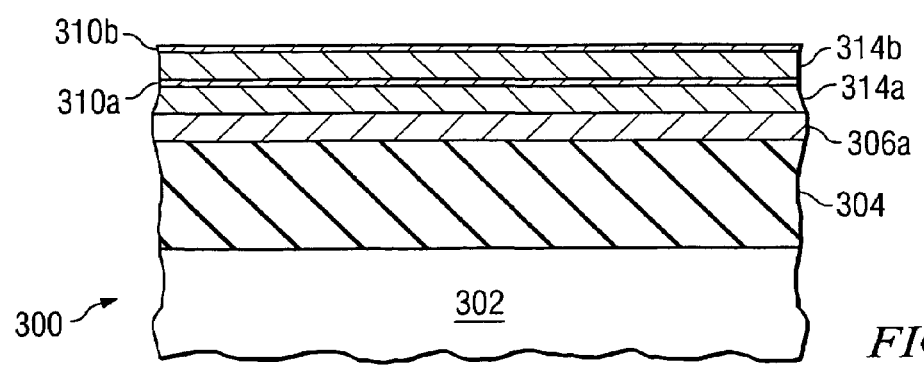

FIGS. 6 through 8 shows cross-sectional views of a semiconductor device at various stages of manufacturing in accordance with another embodiment of the invention. In this embodiment, an unpatterned material layer 304 is shown, for example. In this embodiment, a plurality of barrier layers 306a/314a (FIG. 6), and 314b (FIG. 7) are deposited over the material layer 304, and each barrier layer 306a/314a, and 314b is exposed to a nitridation treatment 308a and 308b, respectively. The barrier layer 306a/314a shown in FIG. 6 comprises two material layers 306a and 314a. Preferably, in one embodiment, the layer 306a that is adjacent the material layer 304 includes nitrogen, to avoid forming an oxide at the surface of the material layer 304, for example.

In one embodiment, a barrier layer 306a/314a is formed, comprising a first layer of material 306a that comprises a nitride such as TaN, and a second layer of material 314a that comprises a non-nitride material such as Ta. The device 300 is exposed to a nitridation treatment 308a to form a nitrogen rich region 310a at the top surface of the barrier layer 306a/314a, as shown in FIG. 7. A layer of material 314b comprising one or more layers of Ta and/or TaN, as examples, is deposited over the nitrogen rich region 310a, as shown, and is exposed to another nitridation treatment 308b, to form another nitrogen rich region 310b at the top surface of layer 314b, as shown in FIG. 8. Advantageously, a multilayer structure comprising a plurality of nitrogen rich regions 310a and 310b (and/or additional nitrogen rich regions, not shown) may be fabricated by depositing additional material layers and treating them with a nitridation treatment.

In one embodiment, the barrier layer deposited does not include nitrogen when deposited, for example. Nitrogen is introduced in the barrier layer top surface using the nitridation treatment, in this embodiment. For example, referring again to FIG. 1, the barrier layer 106 may comprise a single layer of a non-nitride material such as Ta or Ti, although alternatively, the barrier layer 106 may comprise W, TaSi, or TiSi, as examples. The nitridation treatment 108 (FIG. 2) forms a layer of nitrogen rich region of a nitride such as TaN or TiN 110 at the top surface of the barrier layer 106' in this embodiment, as shown in FIG. 3. Additional barrier layers 106 comprising a non-nitride material such as Ta or Ti may then be deposited over the nitrogen rich region 110 and nitrided, as described herein, for example. This embodiment is advantageous because a deposition tool and process to deposit TaN or TiN is avoided. Furthermore, because only the top surface of the barrier layer 106' is nitrided (e.g., at nitrogen rich region 110) and the lower region 106 is not nitrided, the barrier layer 106' has decreased electrical resistance.

Figure 9:
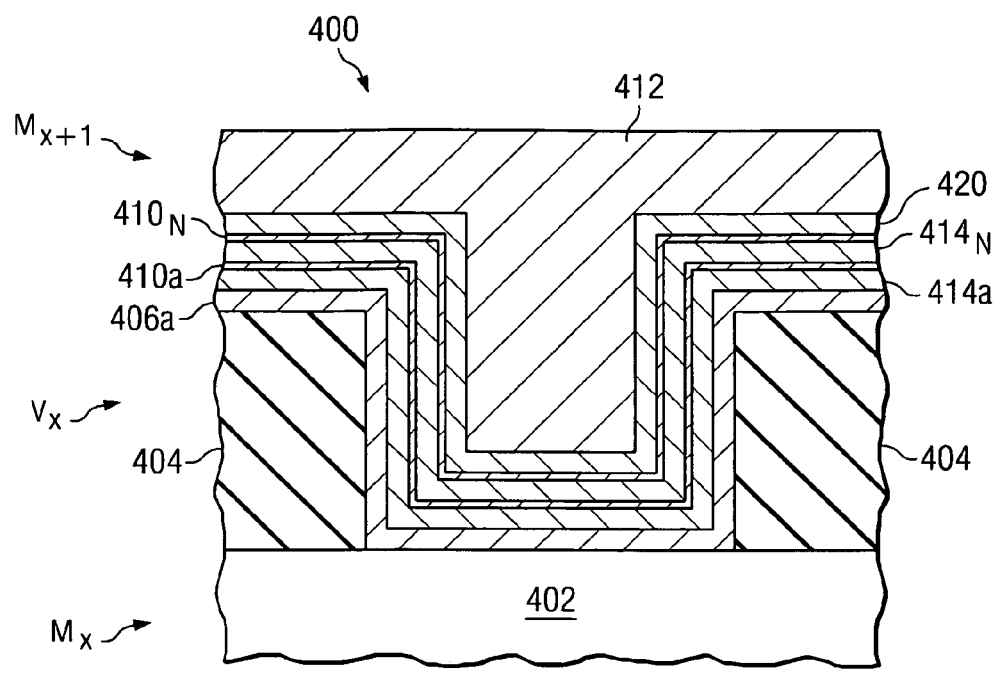
FIG. 9 shows a cross-sectional view of a semiconductor device in accordance with another embodiment of the invention.

FIG. 9 shows a cross-sectional view of a semiconductor device in accordance with another embodiment of the invention. The barrier layers described herein are shown implemented in a multi-level interconnect structure, formed in a dual damascene structure (e.g., in via level $V_x$ and metallization layer $M_{x+1}$. The workpiece 402 includes a first metallization layer or level of interconnect $M_x$. A material layer 404 comprising an ILD is formed over the first metallization layer $M_x$. The material layer 404 is patterned with a pattern for vias and conductive lines. The barrier layers 406a, 414a, 410a, 414$_N$ and 410$_N$ (where N indicates the number of additional material layers and may be 0, 1, 2, 3, or greater, for example) are formed over the patterned material layer 404, with the nitrogen rich regions 410a and 410$_N$ being formed using the nitridation treatments described herein (e.g., with reference to nitridation treatment 108 of FIG. 2). A seed layer 420 may be formed over the top nitrogen rich region 410$_N$, and a conductive material 412 is deposited over the seed layer 420, as shown.

Figure 10:
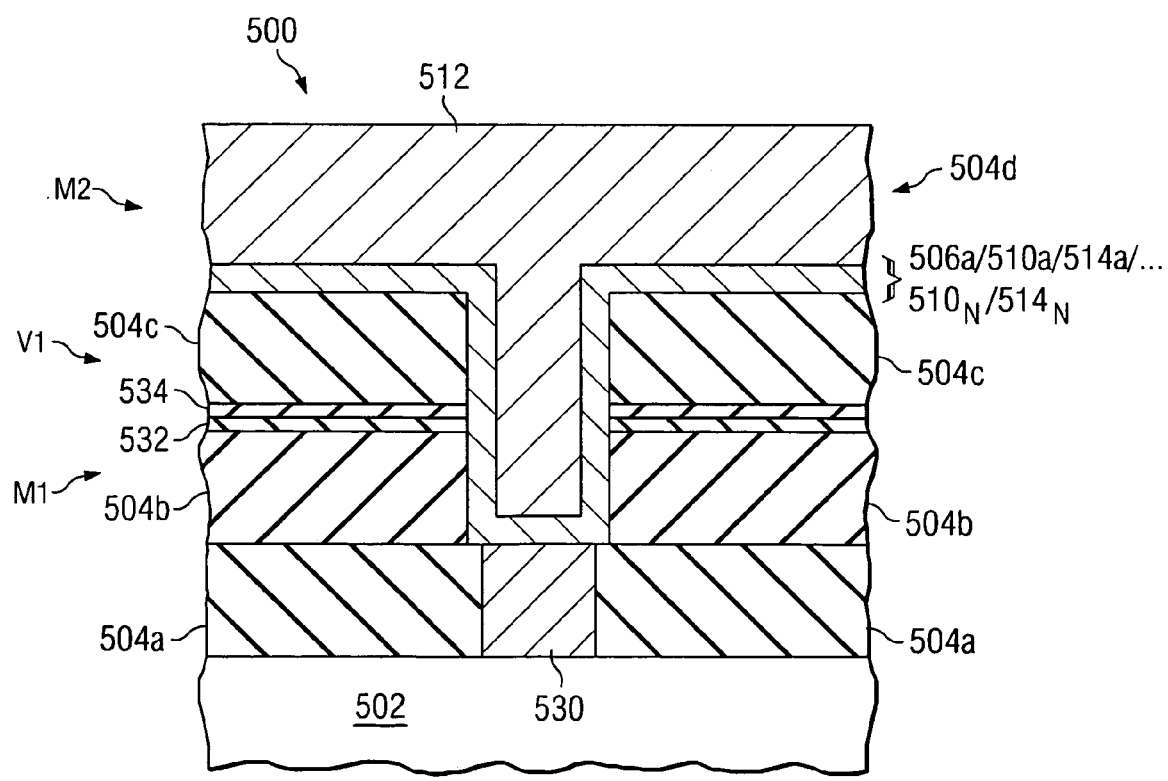
FIG. 10 shows a cross-sectional view of a semiconductor device in accordance with yet another embodiment of the invention.

FIG. 10 shows a cross-sectional view of a semiconductor device in accordance with yet another embodiment of the invention. In this embodiment, the multi-layer interconnect structure includes a tungsten plug 530 formed in a lower material layer 504a. A hard mask 532 comprising tetra ethyl oxysilane (TEOS) and a cap layer 534 comprised of CoWP may be disposed between material layer 504b and 504c of the M1 layer and the V1 layer, respectively, as shown. The barrier layers of the present invention 506a/514a/510a/ . . . 514$_N$/510$_N$ are formed over a patterned plurality of material layers 504b, 504c, and 504d, as shown.

Embodiments of the present invention include semiconductor devices manufactured in accordance with the methods described herein. The semiconductor device 100 preferably includes at least one barrier layer 106' having a nitrogen rich region 110 formed at a top structure thereof, as shown in FIG. 3. The semiconductor device may include a first barrier layer 406a and at least one second barrier layer 414a . . . 414$_N$ formed over the first barrier layer 406a, as shown in FIG. 9. Each second barrier layer 414a . . . 414$_N$ is preferably exposed to a nitridation treatment to form a nitrogen rich region 410a . . . 410$_N$ at a top surface thereof, in some embodiments.

Advantages of embodiments of the invention include providing improved barrier layers 106', 206/214/210, 306a/314a/310a/314b/310b, 406a/414a/410a/414$_N$/410$_N$, and 506a/514a/510a/514$_N$/510$_N$ having nitrogen rich regions 110, 210, 310a, 310b, 410a, 410$_N$, 510a, 510$_N$ at the top surfaces of the material layers 106, 214, 314a, 314b, 414a, 414$_N$, 514a, and 514$_N$, respectively. The novel barrier layers 106', 206/214/210, 306a/314a/310a/314b/310b, 406a/414a/410a/414$_N$/410$_N$, and 506a/514a/510a/514$_N$/510$_N$ have improved diffusion prevention and increased oxidation resistance.

Referring again to FIGS. 1 through 3, if the barrier layer 106 deposited comprises compositionally weak TiN or TaN, for example, the nitridation treatment 108 compensates the compositionally weak underlying material 106 and forms a robust barrier layer 106' comprising a nitrogen rich region 110. Thus, the novel nitridation treatment 108 may be used as a nitridation enhancement for a nitride layer 106.

If the barrier layer 106 comprises a non-nitride material such as Ta or Ti, a nitride layer deposition step is not required, because a nitride barrier layer 106' can be formed using the nitridation treatment 108 described herein. The novel nitridation treatment 108 may be used for surface nitridation of a metal layer 106 in this embodiment. The resistivity $R_s$ of the barrier layer 106' is reduced because only the surface (e.g., nitrogen rich region 110) is nitrided, in this embodiment. In this embodiment, the barrier layer 106 comprises a metal, and the nitrogen rich region 110 comprises a nitride of the metal, for example.

Furthermore, a plurality of barrier layers may be deposited and exposed to the nitridation treatment (see 406b, 414a, 410a, 414$_N$ and 410$_N$ in FIG. 9) to form a multi-stack of enhanced barrier layers. The barrier layers 406b, 414a, and 414$_N$ may be deposited thinly (e.g., they may be a few Angstroms thick) and the total thickness can be defined by the requirements for the metallization layers they are used in. Barrier layer stacks comprising TaN/Ta/TaN/Ta, TiN/Ti/TiN/Ti, TaN/Ti/TiN/Ta/TaN layers (and additional layers), or combinations or multiple layers of Ta, TaN, Ti, TiN, W, WN, TaSi, TaSiN, TiSi, or TiSiN, as examples, may be formed. A multi-layer stack of barrier layers provides increased oxidation resistance, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a barrier layer on a material layer of a semiconductor device, the method comprising:

forming a first metal layer selected from the group consisting of Ti (titanium), Ta (tantalum) and W (tungsten) over the material layer, the first metal layer having a top surface;

exposing said top surface of the first metal layer to a nitridation treatment to convert a top portion of said first metal layer to a nitride layer of the first metal layer; and said nitridation treatment further forming a nitrogen rich region at a top surface of the nitride layer such that a remaing portion of said metal layer, said nitride layer and said nitrogen rich region form a first barrier layer.

2. The method according to claim 1, wherein forming the first metal layer comprises forming a layer comprising a thickness of about 150 Angstroms or less.

3. The method according to claim 1, wherein the nitrogen rich region comprises a thickness of about 15 Angstroms or less.

4. The method according to claim 1, wherein exposing the first metal layer to the nitridation treatment comprises exposing the first metal layer to N2 plasma, N2/U2 plasma, NH3 plasma, or a rapid thermal process (RTP) in a nitrogen gas ambient.

5. The method according to claim 1, wherein the nitridation treatment comprises a temperature of about 750 degrees C. or less.

6. The method according to claim 1, further comprising forming at least one second metal layer selected from the group consisting of Ti, Ta and W over the first barrier layer.

7. The method according to claim 6, further comprising exposing the at least one second metal layer to a second nitridation treatment, to convert a top portion of said second metal layer to a second nitride layer of the second metal layer, and to form a nitrogen rich region at the top surface of the at least one second metal layer and the second metal nitride layer.

8. The method according to claim 1, wherein the first metal layer and the at least one second metal layer of material comprise different material.

9. The method according to claim 1, wherein both the step of forming the first metal layer is in a first chamber, and exposing the first metal layer to the nitridation treatment is in the first chamber.

10. The method according to claim 1, wherein the step of forming the first metal layer is in a first chamber, and wherein the step of exposing the first metal layer to a nitridation treatment is in a second chamber.

11. The method according to claim 1 wherein the material layer comprises an insulating material, further comprising:
  patterning the material layer, wherein forming the barrier layer comprises forming the barrier layer over the patterned material layer;
  depositing at least one conductive material over the barrier layer, and
  removing the at least one conductive material from over a top surface of the material layer to form conductive features within the material layer.

12. The method according to claim 11, wherein depositing the at least one conductive material comprises depositing a seed layer, and depositing a conductive material over the seed layer.

* * * * *

UNITED STATES PATENT AND TRADEMARK OFFICE
CERTIFICATE OF CORRECTION

| | | |
|---|---|---|
| PATENT NO. | : 7,229,918 B2 | Page 1 of 1 |
| APPLICATION NO. | : 11/057631 | |
| DATED | : June 12, 2007 | |
| INVENTOR(S) | : Moon | |

It is certified that error appears in the above-identified patent and that said Letters Patent is hereby corrected as shown below:

In Col. 9, line 6, delete "N2/U2" and insert --N2/H2--.
In Col. 9, line 24, delete "different material" insert --different materials--.

Signed and Sealed this

Fourth Day of September, 2007

JON W. DUDAS
*Director of the United States Patent and Trademark Office*